United States Patent
Sato et al.

(10) Patent No.: US 6,536,097 B1
(45) Date of Patent: Mar. 25, 2003

(54) METHOD OF PREPARING AND HANDLING OXIDE SUPERCONDUCTING WIRE

(75) Inventors: Kenichi Sato, Osaka (JP); Hidehito Mukai, Osaka (JP); Nobuhiro Shibuta, Osaka (JP)

(73) Assignee: Sumitomo Electric Industries, Ltd. (JP)

( * ) Notice: Subject to any disclaimer, the term of this patent is extended or adjusted under 35 U.S.C. 154(b) by 0 days.

(21) Appl. No.: 09/723,170

(22) Filed: Nov. 27, 2000

Related U.S. Application Data

(62) Division of application No. 08/747,881, filed on Nov. 13, 1996, now Pat. No. 6,205,345, which is a continuation of application No. 08/247,615, filed on May 23, 1994, now abandoned, which is a continuation of application No. 07/677,047, filed on Mar. 29, 1991, now abandoned.

(30) Foreign Application Priority Data

Mar. 30, 1990 (JP) ............................................... 2-87052
Sep. 7, 1990 (JP) ............................................. 2-238166
Sep. 7, 1990 (JP) ............................................. 2-238167

(51) Int. Cl.$^7$ ............................................... H01L 39/24
(52) U.S. Cl. .................... 29/599; 174/125.1; 174/126.1; 264/125
(58) Field of Search .......................... 29/599; 174/125.1, 174/126.1; 264/125

(56) References Cited

U.S. PATENT DOCUMENTS 4,988,669 A * 1/1991 Dersch
5,106,825 A * 4/1992 Mandigo et al. ............... 29/599
5,132,278 A * 7/1992 Stevens et al.

* cited by examiner

Primary Examiner—Carl J. Arbes
(74) Attorney, Agent, or Firm—Pennie & Edmonds LLP

(57) ABSTRACT

In order to obtain a superconducting wire containing an oxide superconductor, whose critical current density is not much reduced upon application of bending, a plurality of strands 3, comprising oxide superconductors 1 covered with first metal sheaths 2, are filled into a second metal sheath 4, and deformation processing is performed to sectionally apply a compressive load to the second metal sheath, so that the thickness of the oxide superconductor 1 contained in each strand 3 is not more than 5% of the overall thickness of the superconducting wire 6.

8 Claims, 1 Drawing Sheet

METHOD OF PREPARING AND HANDLING OXIDE SUPERCONDUCTING WIRE

This is a division of application Ser. No. 08/747,881, filed Nov. 13, 1996 now U.S. Pat. No. 6,205,345, which is a continuation of Ser. No. 08/247,615 filed May 23, 1994 abandoned, which is a continuation of Ser. No. 07/677,047 filed Mar. 29, 1991 abandoned.

BACKGROUND OF THE INVENTION

1. Field of the Invention

The present invention relates to an oxide superconducting wire, a method of preparing the same, and a method of handling the same, and more particularly, it relates to improvement for distortion resistance of critical current density in an oxide superconducting wire.

2. Description of the Background Art

In recent years, superconducting materials of ceramics, i.e., oxide superconducting materials, are watched as materials exhibiting higher critical temperatures. In particular, those of yttrium-based, bismuth-based and thallium-based, which exhibit high critical temperatures of about 90 K, 110 K and 120 K respectively, are expected as practicable superconducting materials.

In relation to a method for obtaining an oxide superconducting wire, such as a long superconducting wire or a superconducting pattern which is wired on a proper substrate, using a superconductor of such an oxide superconducting material, known is a method of covering raw material powder with a metal sheath and heat treating the same for bringing the raw material powder into a desired superconducting material, thereby preparing an oxide superconducting wire comprising a superconductor covered with the metal sheath. The as-formed superconducting wire is applicable to a cable, a bus bar, a current lead, a magnet, a coil or the like.

In order to apply the aforementioned superconducting wire to a cable, a magnet or the like, it is necessary to attain a high critical current density, in addition to a high critical temperature. In particular, it is necessary to ensure a critical current density required under a magnetic field which is applied to the superconducting wire, while such a high critical current density must be maintained under distortion which is applied to the superconducting wire.

However, a superconducting wire containing an oxide superconductor is so far inferior in distortion resistance of critical current density that the critical current density is reduced when the superconducting wire is bent at a certain curvature level, for example.

SUMMARY OF THE INVENTION

Accordingly, an object of the present invention is to provide an oxide superconducting wire, whose critical current density is not much reduced even if the same is distorted, and a method of preparing the same.

Another object of the present invention is to provide a preferable method of handling the aforementioned superconducting wire.

The inventive oxide superconducting wire, which has the so-called multicore structure, comprises a metal sheath and a plurality of superconductors independently distributed in the metal sheath along the thickness direction of the metal sheath. The thickness-directional dimension of each superconductor is set to be not more than 5% of the thickness-directional outside dimension of the metal sheath.

The present invention is particularly advantageously applied to a superconductor which is prepared from an oxide superconductor.

The present invention also provides a method of preparing a superconducting wire, which contains the aforementioned oxide superconductor. This method comprises a step of preparing a plurality of strands formed by oxide superconductors which are covered with first metal sheaths, a step of filling the plurality of strands into a second metal sheath, and a step of performing deformation processing for applying cross-sectionally a compressive load to the second metal sheath at least one time, being filled with the plurality of strands, so that the thickness of the superconductor contained in each strand is not more than 5% of the thickness-directional outside dimension of the second metal sheath and the second metal sheath is deformed into a tape.

The present invention further provides a method of handling an oxide superconducting wire. The oxide superconducting wire comprises a metal sheath having a thickness-directional dimension and a plurality of oxide superconductors which are independently distributed in the metal sheath in the thickness direction. The thickness-directional dimension of each oxide superconductor is set to be not more than 5% of the thickness-directional outside dimension of the metal sheath. In order to handle such an oxide superconducting wire, distortion (thickness of metal sheath/bend diameter) is controlled in a range of not more than 0.3%.

Once a superconductor is cracked, such cracking is easily propagated. This tendency is remarkable in an oxide superconductor of ceramics. When the superconductor is distorted in excess of a certain level, therefore, the superconductor is cracked and such cracking is propagated to portions having smaller distortion, to reduce the critical current density. According to the present invention, however, a superconductor is so divided that the thickness of each superconductor part is not more than a prescribed value, whereby it is possible to prevent propagation of cracking without reducing a flowable current value. Thus, distortion resistance of critical current density can be improved.

Thus, according to the present invention, it is possible to obtain a superconducting wire, whose critical current density is not much reduced even if the same is distorted. Therefore, it is possible to apply an oxide superconducting wire, which must have high distortion resistance in particular, to a significantly distorted element such as a cable or a magnet, for example, with no problem.

When an oxide superconductor is employed in the present invention, such an oxide superconductor is preferably c-axis oriented in the thickness direction.

The oxide superconductor may be any one of yttrium, bismuth and thallium, while a bismuth oxide superconductor is particularly optimum. In such a bismuth oxide superconductor, having components of Bi—Sr—Ca—Cu—O or (Bi,Pb)—Sr—Ca—Cu—O, the a-b plane of a 2223 phase showing a critical temperature of 110 K, which has a 2223 composition of the components Bi— or (Bi, Pb)—Sr—Ca—Cu, is preferably oriented in a direction of current flow. According to the present invention, it is possible to easily attain such a structure that the a-b plane of the 2223 phase, showing a critical temperature of 110 K, is oriented in the direction of current flow.

The bismuth oxide superconductor is regarded as particularly preferable, also in a point that it satisfies all conditions of higher critical temperature and critical current density, small toxicity, and no requirement for rare earth elements as compared with yttrium and thallium oxide superconductors.

According to the present invention, it has been found possible to improve distortion resistance of critical current density also in relation to yttrium and thallium oxide superconductors, since degrees of orientation thereof can be improved to some extent.

The inventive superconducting wire may be shaped into a wire, so that the same is practicable in a wider range.

When the inventive superconducting wire, which is shaped into a wire, may be further covered with an organic coat of an organic material, superconducting properties of the superconducting wire can be further stabilized against bending.

According to the inventive method of preparing an oxide superconducting wire, it is easy to divide the thickness of an oxide superconductor, which is covered with a metal sheath, so that the thickness of each superconductor part is not more than 5% of the overall thickness of the superconducting wire.

The strands may be drawn before the same are filled into the second metal sheath, in order to effectively reduce the thickness of each superconductor contained in the as-formed oxide superconducting wire.

The second metal sheath is preferably deformed into a flat tape by deformation processing which is applied in the inventive preparation method.

In order to improve the critical current density, heat treatment is preferably performed after the deformation processing. Further, it is more preferable to repeat such deformation processing and heat treatment a plurality of times.

It is possible to easily adjust the thickness of each superconductor contained in the oxide superconducting wire obtained in the step of deformation processing, by varying the number of strands which are filled into the second metal sheath. For example, the thickness of each superconductor can be easily reduced after deformation processing, by increasing the number of the strands.

According to the present invention, further, it is possible to substantially prevent deterioration of superconducting properties resulting from distortion, by controlling the distortion, which is applied to the superconducting wire containing oxide superconductors, in a range of not more than 0.3%, as hereinabove described. Such distortion control is performed in various steps, including heat treatment, for example, for preparing the superconducting wire, and processes of delivery from a reel after preparation, winding on the reel, and shaping into a cable, a bus bar, a power lead, a coil, or the like. When the distortion is thus controlled in a range of not more than 0.3%, the critical current density is not substantially reduced even if the superconducting wire is repeatedly distorted. Thus, it is possible to apply the superconducting wire to various uses.

When the superconducting wire is heat treated in a state wound at a curvature level applying distortion of not more than 0.3%, the superconducting properties are not in the least or hardly deteriorated during heat treatment and delivery. Thus, it is possible to obtain a superconducting wire which shows stable superconducting properties particularly against bending.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
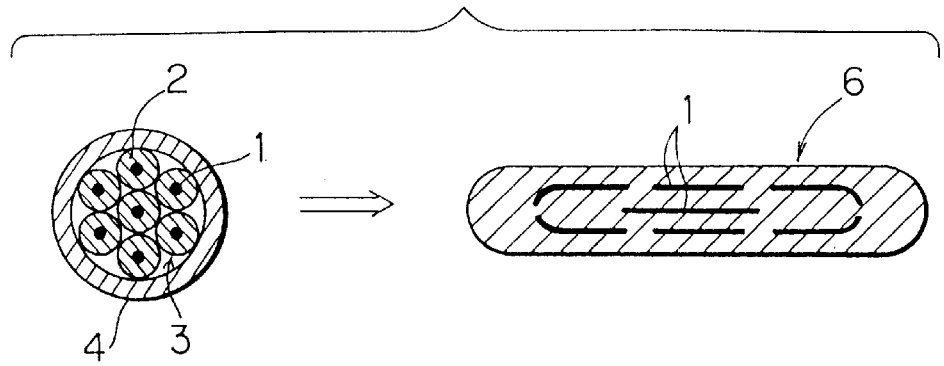
FIG. 1 is a sectional view for illustrating a deformation processing step included in the inventive method of preparing an oxide superconducting wire.

In order to obtain a superconducting wire containing oxide superconductors according to the present invention, the following preparation method is applied, for example:

First, an oxide superconductor is filled into a first metal sheath, to obtain a strand. This strand is drawn to be thinned. A plurality of such thinned strands are then filled into a second metal sheath, and subjected to deformation processing such as drawing and rolling, for further thinning. Thus obtained is such an oxide superconducting wire that the thickness of the oxide superconductor contained in each strand is not more than 5% of the overall thickness. This oxide superconducting wire is in the form of a flat tape, for example.

In order to increase the critical current density of the oxide superconducting wire, thereafter drawing and rolling are further performed, followed by heat treatment. Then, rolling and heat treatment may be again performed. In this case, drawing may be substituted for rolling, in combination with heat treatment.

When a bismuth oxide superconductor is employed, the temperature for heat treatment is made slightly higher than that for dominantly forming a 2223 phase, so that a structure having a high target critical current density can be attained.

It is preferable to prepare powder, which is first filled into the first metal sheath, in a submicron state, in order to obtain a superconductor having an excellent uniformity.

The heat treatment temperature cannot be univocally determined since the optimum value is selected in relation to the heat treatment atmosphere. For example, a fairly low heat treatment temperature is employed when the oxygen partial pressure of the heat treatment atmosphere is reduced.

The metal sheath is adapted to stabilize the superconducting wire. Such a metal sheath is suitably prepared from a metal, such as silver, a silver alloy, gold or a gold alloy, for example, which is not reactive with the superconductor and has excellent workability and small resistivity for serving as a stabilizer. As to the first and second metal sheaths employed in the inventive preparation method, particularly the first metal sheath must not be reactive with the superconductor, while the second metal sheath may not satisfy such a condition. However, the first and second metal sheaths are preferably formed of silver, a silver alloy, gold or a gold alloy, in general. Particularly in relation to the first metal sheath, only a surface to be brought into contact with the superconductor may be covered with a layer of a metal which is not reactive with the superconductor. In this case, other portions of the metal sheath may be formed of another type of metal such as copper or its alloy, or aluminum or its alloy, for example.

The deformation processing includes drawing, rolling and the like, for example. In order to improve the critical current density, the deformation ratio is preferably at least 80% in drawing as well as in rolling. Such deformation processing is preferably followed by heat treatment, while such deformation and heat treatment are preferably repeated a plurality of times, in order to further effectively improve the critical current density. When rolling is performed a plurality of times, for example, the deformation ratio for a single pass is preferably at least 40%. When rolling or drawing is again performed after the heat treatment, the deformation ratio in such processing may be 10 to 30%. The rolling is performed with a roll or a press, for example.

After the heat treatment, the as-formed superconducting wire may be further coated with an organic material. In this case, the superconducting wire is passed through a bath of the organic material, or the surface of the superconducting wire is painted with the organic material.

Experimental Examples carried out according to the present invention are now described.

EXPERIMENTAL EXAMPLE 1

$Bi_2O_3$, PbO, $SrCO_3$, $CaCO_3$ and CuO were blended so that Bi, Pb, Sr, Ca and Cu were in composition ratios of 1.85:0.41:2.01:2.19:2.98. This blend was heat treated at 750° C. for 12 hours and at 800° C. for 8 hours in the atmospheric air, and then at 760° C. for 8 hours in a decompressed atmosphere of 1 Torr, in this order. The blend was pulverized after each heat treatment. The as-formed powder was further pulverized with a ball mill, to obtain submicron powder. This submicron powder was degassed in a decompressed atmosphere at 800° C. for 10 minutes.

The as-formed powder was filled into a silver pipe of 12 mm in diameter (outer diameter), which in turn was drawn into 1.8 mm in diameter, to obtain a strand. Arbitrary numbers of such strands were again filled into silver pipes, which were subjected to drawing and rolling, heat treated, and again rolled and heat treated, to obtain samples Nos. 1 to 5 shown in Table 1.

TABLE 1

| Sample No. | Distortion | | | | |
|---|---|---|---|---|---|
| | 0.1 | 0.3 | 0.5 | 1.5 | 3.0 |
| 1 | 98 | 75 | 61 | 29 | 20 |
| 2 | 98 | 80 | 70 | 42 | 28 |
| 3 | 99 | 83 | 72 | 50 | 39 |
| 4 | 99 | 97 | 95 | 80 | 71 |
| 5 | 100 | 98 | 96 | 94 | 80 |

The thickness of each superconductor with respect to the overall thickness of the superconducting conductive body was 32% in the sample No. 1, 15% in the sample No. 2, 6.2% in the sample No. 3, 4.3% in the sample No. 4, and 2.0% in the sample No. 5.

Figure 2:
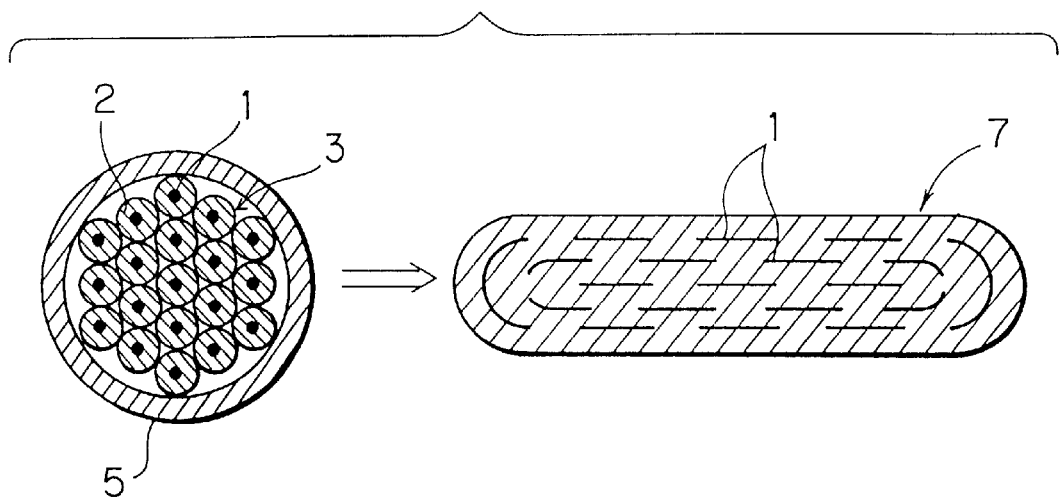
FIG. 2 is a sectional view corresponding to FIG. 1, illustrating another oxide superconducting wire with a larger number of strands 3.

FIGS. 1 and 2 show a method employed for obtaining the samples having different thicknesses of the superconductors with respect to the overall thicknesses of the wire.

Each of FIGS. 1 and 2 shows a plurality of strands 3 comprising oxide superconductors 1 covered with first metal sheaths 2. Referring to FIG. 1, seven strands are filled into a second metal sheath 4. On the other hand, 19 strands 3 are filled into a second metal sheath 5 in FIG. 2. Deformation processing such as rolling, for example, is performed in such states, to obtain flat tape type superconducting wires 6 and 7, respectively.

Comparing these superconducting wires 6 and 7, the thickness of each oxide superconductor 1 is set to be about 30% of the overall thickness of the superconducting wire 6 in FIG. 1. In the superconducting wire 7 shown in FIG. 2, on the other hand, the thickness of each oxide superconductor 1 is set to be about 15% of the overall thickness of the superconducting wire 7.

Thus, it is possible to adjust the thickness of each superconductor contained in a superconducting wire obtained by deformation processing, depending on the number of strands which are filled into a second metal sheath. In each of the aforementioned samples, the thickness of each superconductor was adjusted by the technique shown in FIGS. 1 and 2.

As to the superconducting wires obtained in the aforementioned manner, distortion-critical current density characteristics at the liquid nitrogen temperature were compared with each other. Table 1 also shows the results.

Each numerical value shown in Table 1 was calculated from $J_C/J_{C0} \times 100$ [%], where $J_{C0}$ represents a critical current density with application of no distortion and $J_C$ represents a critical current density upon application of prescribed distortion.

It is understood from Table 1 that the samples Nos. 4 and 5, in which the thickness of each superconductor was set to be not more than 5% of the overall thickness of the wire, are excellent in distortion resistance.

EXPERIMENTAL EXAMPLE 2

Oxides or carbonates containing Bi, Pb, Sr, Ca and Cu were mixed with each other so that these elements were in composition ratios of 1.78:0.44:1.99:2.23:2.98, to prepare powder, which was formed of a 2212 phase, containing Bi+Pb, Sr, Ca and Cu in ratios of about 2:2:1:2, and non-superconducting phases.

This powder was degassed at 720° C. for 10 hours in a decompressed atmosphere of 8 Torr.

The as-formed powder was first covered with a silver pipe of 12 mm in outer diameter and 8 mm in inner diameter, drawn into 1 mm in outer diameter, and then introduced into a silver pipe having a larger diameter, to obtain a multicore wire having 1296 cores. Then the multicore wire was drawn into 1 mm in outer diameter, and thereafter rolled into 0.17 mm in thickness.

This wire was heat treated at 840° C. for 50 hours, thereafter rolled at a deformation ratio of 11.8%, and then wound on an alumina/silica ceramic cylinder of 50 mm in diameter. In such a wound state, the wire was at a curvature level applying distortion of 0.3%.

In this state, the wire was heat treated at 840° C. for 50 hours. Immediately after the heat treatment, the wire exhibited a critical current density of 7000 $A/cm^2$ at the liquid nitrogen temperature.

Then the wire was delivered from the cylinder, and repeatedly bent on a peripheral surface of a cylinder having the same diameter and returned to a linear state 40 times. After this process, the wire exhibited the same critical current density as that measured immediately after the heat treatment.

EXPERIMENTAL EXAMPLE 3

Oxides or carbonates containing Bi, Pb, Sr, Ca and Cu were mixed with each other so that these elements were in composition ratios of 1.78:0.44:1.96:2.25:2.99, to prepare powder which was formed of a 2212 phase and non-superconducting phases.

This powder was degassed at 700° C. for 7 hours in a decompressed atmosphere of 11 Torr.

The as-formed powder was covered with a silver pipe of 12 mm in outer diameter and 8 mm in inner diameter, drawn into 1 mm in outer diameter, and inserted in a silver pipe having a larger diameter, to prepare a multicore wire having 1260 cores. The multicore wire was drawn into 1 mm in outer diameter, and then rolled into 0.17 mm in thickness.

A pair of such wires were brought into close contact with each other, heat treated at 840° C. for 50 hours in this state, and thereafter rolled at a deformation ratio of 15%.

The as-formed double wire was wound on a ceramic bobbin having a diameter corresponding to distortion of 0.29%, and heat treated at 840° C. for 50 hours.

The double wire was then newly wound on another bobbin of the same diameter, and further spirally wound on a Teflon (trade name) pipe of the same diameter in a pitch of 60 mm.

Then the wire was repeatedly bent into 100 mm and 200 mm in radius 10 times.

After the respective stages of the heat treatment, new winding and bending, the wire was subjected to measurement of critical current density in liquid nitrogen. The result was 8000 A/cm$^2$ in each stage.

EXPERIMENTAL EXAMPLE 4

Oxides or carbonates containing Bi, Pb, Sr, Ca and Cu were mixed with each other so that these elements were in composition ratios of 1.76:0.43:1.98:2.20:3.02, to prepare powder which was formed of a 2212 phase and non-superconducting phases by heat treatment.

This powder was degassed at 710° C. for 12 hours in a decompressed atmosphere of 15 Torr.

The as-formed powder was covered with a silver pipe of 12 mm in outer diameter and 8 mm in inner diameter, drawn into 1 mm in outer diameter, and then inserted in a silver pipe having a larger diameter, to prepare a multicore wire having 1260 cores. The multicore wire was then drawn into 1 mm in outer diameter, and thereafter rolled into 0.17 mm in thickness.

This wire was heat treated at 840° C. for 50 hours, thereafter rolled at a draft of 11.8%, and wound on an alumina/silica ceramic cylinder of 50 mm in diameter. In such a wound state, the wire was at a curvature level applying distortion of 0.3%.

The wire was heat treated at 840° C. for 50 hours in this state.

Then the wire was delivered from the cylinder, and repeatedly passed through a formal bath at a linear velocity of 20 m/min. and baked at 350° C. 10 times, to be provided with a formal coat of 30 to 50 $\mu$m in thickness. In every step, distortion was controlled to be not more than 0.3%.

This wire was wound on a bobbin of 50 mm in diameter, to prepare a coil. This coil exhibited a critical current density of 6000 A/cm$^2$ at the liquid nitrogen temperature.

EXPERIMENTAL EXAMPLE 5

Oxides or carbonates containing Bi, Pb, Sr, Ca and Cu were mixed with each other so that these elements were in composition ratios of 1.82:0.42:1.99:2.22:3.01, to prepare powder which was formed of a 2212 phase and non-superconducting phases by heat treatment.

This powder was degassed at 700° C. for 15 hours in a decompressed atmosphere of 10 Torr.

The as-formed powder was covered with a silver pipe of 12 mm in outer diameter and 8 mm in inner diameter, drawn into 1 mm in outer diameter, and further inserted in a silver pipe having a larger diameter, to prepare a multicore wire having 1260 wires. The multicore wire was drawn into 1 mm in outer diameter, and then rolled into 0.17 mm in thickness.

This wire was heat treated at 840° C. for 50 hours, and thereafter rolled at a deformation ratio of 15%.

This wire was wound on a ceramic bobbin having a diameter corresponding to distortion of 0.29%, and heat treated at 840° C. for 50 hours.

Then the wire was delivered from the bobbin, and passed through a formal bath and baked in a furnace of 400° C. for about 10 seconds. This operation was repeated 10 times. In every step, distortion was suppressed to be not more than 3%. Thus obtained was a wire having a formal coat of 40 mm in thickness.

This wire was wound on a stainless steel tube having a diameter of 50 mm in a pitch of 50 mm as a conductor for a cable, and bent at a radius of curvature of 70 cm.

After the respective stages of the heat treatment, formal coating, new winding and bending, the wire was subjected to measurement of critical current density in liquid nitrogen. The result was 7500 A/cm$^2$ in each stage.

Although the present invention has been described and illustrated in detail, it is clearly understood that the same is by way of illustration and example only and is not to be taken by way of limitation, the scope of the present invention being limited only by the terms of the appended claims.

What is claimed is:

1. A method of preparing an oxide superconducting wire comprising the steps of:

preparing a plurality of strands being formed of oxide superconductors covered with first metal sheaths;

filling said plurality of strands into a second metal sheath; and performing deformation processing for applying cross-sectionally applying a compressive load on said second metal sheath, being filled with said plurality of strands, so that the thickness of each said superconductor contained in each said strand is not more than 5% of the thickness-directional outside dimension of said second metal sheath and said second metal sheath is deformed into a tape.

2. A method of preparing an oxide superconducting wire in accordance with claim 1, further comprising a step of drawing said strands before said step of filling said plurality of strands into said second metal sheath.

3. A method of preparing an oxide superconducting wire in accordance with claim 1, wherein said second metal sheath is deformed into a flat tape in said deformation processing step.

4. A method of preparing an oxide superconducting wire in accordance with claim 1, further comprising a step of heat treating said oxide superconductors after said deformation processing step.

5. A method of preparing an oxide superconducting wire in accordance with claim 4, wherein each of said deformation processing step and said heat treatment step is repeated a plurality of times.

6. A method of preparing an oxide superconducting wire in accordance with claim 1, further comprising a step of adjusting the thickness of each said superconductor contained in said oxide superconducting wire obtained in said deformation processing step by controlling the number of said strands being filled into said second metal sheath.

7. A method of preparing an oxide superconducting wire in accordance with claim 4, wherein said heat treatment step comprises a step of heat treating said superconducting wire in a state being wound at a curvature level applying distortion (distortion=thickness of superconducting wire/bend diameter) of not more than 0.3% and thereafter delivering the same from said state being wound at said curvature level.

8. A method of handling an oxide superconducting wire comprising a metal sheath having a thickness-directional dimension and a plurality of oxide superconductors independently distributed in said metal sheath in said thickness direction, the thickness-directional dimension of each said oxide superconductor being set to be not more than 5% of the thickness-directional outside dimension of said metal sheath, said method being adapted to handle said superconducting wire while controlling distortion (thickness of metal sheath/bend diameter) in a range of not more than 0.3%.

* * * * *